United States Patent
Yilmaz

(10) Patent No.: US 9,625,513 B2
(45) Date of Patent: Apr. 18, 2017

(54) DISCHARGE RATIO STRING CONTINUITY MONITORING

(71) Applicant: Kadir Yilmaz, Toronto (CA)

(72) Inventor: Kadir Yilmaz, Toronto (CA)

(73) Assignee: SOLANTRO SEMICONDUCTOR CORP., Ottawa (CA)

( * ) Notice: Subject to any disclaimer, the term of this patent is extended or adjusted under 35 U.S.C. 154(b) by 198 days.

(21) Appl. No.: 14/611,968

(22) Filed: Feb. 2, 2015

(65) Prior Publication Data
US 2016/0018456 A1    Jan. 21, 2016

Related U.S. Application Data

(60) Provisional application No. 62/025,366, filed on Jul. 16, 2014.

(51) Int. Cl.
| | |
|---|---|
| *G01R 31/26* | (2014.01) |
| *G01R 31/02* | (2006.01) |
| *H02S 50/00* | (2014.01) |
| *H02S 50/10* | (2014.01) |

(52) U.S. Cl.
CPC ............ *G01R 31/026* (2013.01); *H02S 50/00* (2013.01); *H02S 50/10* (2014.12)

(58) Field of Classification Search
CPC ...... G01R 31/026; H02M 7/48; H02M 7/537; H02J 3/383; H02J 3/385; G05F 1/67
See application file for complete search history.

(56) References Cited

U.S. PATENT DOCUMENTS

| | | | | |
|---|---|---|---|---|
| 6,339,538 | B1* | 1/2002 | Handleman | G05F 1/67 136/293 |
| 7,256,566 | B2* | 8/2007 | Bhavaraju | G05F 1/67 320/101 |
| 2012/0025618 | A1* | 2/2012 | Erickson, Jr. | G05F 1/67 307/77 |
| 2013/0026840 | A1* | 1/2013 | Arditi | H02J 1/10 307/77 |

* cited by examiner

Primary Examiner — Minh N Tang
(74) Attorney, Agent, or Firm — Rahman LLC

(57) ABSTRACT

A method for determining continuity in a PV panel string by calculating a discharge ratio includes operatively coupling a PV panel to a PV panel string; measuring a first voltage between points of coupling of the PV panel to the PV panel string; disconnecting the PV panel from the PV panel string; waiting for a discharge period to expire; measuring a second voltage at an expiration of the discharge period; calculating a discharge ratio of the second voltage to the first voltage; and comparing the discharge ratio to a predetermined threshold ratio. An apparatus for determining continuity in a PV panel string includes a discharge resistance serially connected in the PV panel string; a capacitance parallel connected to the discharge resistance; a voltage sensor parallel connected to the discharge resistance; and a first switch parallel connected to the discharge resistance.

19 Claims, 13 Drawing Sheets

DISCHARGE RATIO STRING CONTINUITY MONITORING

CROSS-REFERENCE TO RELATED APPLICATIONS

This application claims priority to U.S. Provisional Patent Application Ser. No. 62/025,366 filed on Jul. 16, 2014, the complete disclosure of which, in its entirety, is hereby incorporated by reference.

BACKGROUND

Technical Field

The embodiments herein generally relate to photovoltaic (PV) solar panels, and more particularly to techniques to ensure safe interaction with PV solar panels.

Description of the Related Art

PV solar panels are an important source of electrical power. Large, megawatt arrays with PV panels numbering in the tens of thousands are increasingly common. A typical PV panel is organized as a series connection of individual PV cells. A common configuration is 72 PV cells per panel. A typical PV cell operating voltage under full illumination is approximately 0.7 V. An illuminated PV panel with 72 direct current (DC) PV cells will therefore have an output voltage of approximately 50 volts DC. PV panels are typically serially connected to form a panel "string". In a DC PV panel system, the output of the PV panel string could connect to a central inverter which converts the DC power of the PV panels into Alternating Current (AC) power suitable for the electrical grid. Typically, there are between five and twenty PV panels in a PV panel string producing a combined voltage of several hundred volts.

PV panels produce power whenever they are illuminated. As described above, the voltages on a PV panel string could reach hazardous levels of hundreds of volts. These voltages could be a safety hazard during PV panel installation and maintenance. If the PV panels are mounted to a roof or integrated into building structures, these voltages can also represent a hazard during emergency operations such as fire fighting since the PV panels will continue to generate voltage even when the PV installation is disconnected from the electrical grid. Accordingly, there remains a need for a technique to allow for safer interaction with PV solar panels.

SUMMARY

In view of the foregoing, an embodiment herein provides a method for determining continuity in a PV panel string by calculating a discharge ratio, the method comprising operatively coupling a PV panel to a PV panel string; measuring a first voltage between points of coupling of the PV panel to the PV panel string; disconnecting the PV panel from the PV panel string; waiting for a discharge period to expire; measuring a second voltage at an expiration of the discharge period; calculating a discharge ratio of the second voltage to the first voltage; and comparing the discharge ratio to a predetermined threshold ratio. The operatively coupling the PV panel to the PV panel string may comprise coupling a panel interface device (PID) that is operatively connected to the PV panel to the PV panel string, wherein the PID permits disconnection of the PV panel from the PV panel string, and wherein the PID permits reconnection of the PV panel to the PV panel string.

The PID may comprise a discharge resistance connected between points of coupling of the PID to the PV panel string. The PID may disconnect the PV panel from the PV panel string upon any of an open circuit in the PV panel string, a high resistance condition in the PV panel string, and a current below a predetermined threshold value in the PV panel string. The PID may comprise a switch; a controller that controls operation of the switch; the discharge resistance operatively connected to the point of coupling; an output capacitance operatively connected to the point of coupling; and a voltage sensor operatively connected to the point of coupling.

The PID may allow the PV panel to be bypassed when the PV panel cannot match a string current in the PV panel string. The PID may comprise a "buck" type DC to DC converter. The PID may convert a DC panel voltage at a first level to a DC output voltage at a second level. The predetermined threshold ratio may be a minimum possible discharge ratio that would occur over the discharge period if the PV panel string is continuous and coupled to an input capacitance of an inverter operatively connected to the PV panel string.

The predetermined threshold ratio may be given by the formula:

$$R = e^{-T_{DIS}/MR_{PID}C_{INV}},$$

wherein: CINV is an input capacitance of an inverter operatively connected to the PV panel string, RPID is a discharge resistance, TDIS is a discharge period, and M is a number of PIDs operatively coupled to the PV panel string.

When the discharge ratio is greater than the predetermined threshold ratio, the method may further comprise operatively coupling the PV panel permanently to the PV panel string. When the discharge ratio is less than the predetermined threshold ratio, the PV panel remains disconnected from the PV panel string. The method may further comprise the PID performing a plurality of discharge ratio measurements. The method may further comprise operatively coupling the PV panel permanently to the PV panel string when a minimum number of consecutive discharge ratio measurements are all greater than a predetermined threshold ratio. The method may further comprise the PID disconnecting the PV panel from the PV panel string during a waiting period between performing the plurality of discharge ratio measurements.

The length of the waiting period may comprise a random value. The method may further comprise the PID operatively coupling the PV panel to the PV panel string during a waiting period between performing the plurality of discharge ratio measurements after a minimum number of consecutive discharge ratio measurements have all been greater than a predetermined threshold ratio. The method may further comprise gradually increasing a duty cycle of the switch to limit a charging current to charge an input capacitance of an inverter operatively connected to the PV panel string. The method may further comprise gradually increasing a duty cycle of the "buck" type DC to DC converter to limit a charging current to charge an input capacitance of an inverter operatively connected to the PV panel string.

Another embodiment provides an apparatus for determining continuity in a PV panel string comprising a discharge resistance serially connected in the PV panel string; a capacitance parallel connected to the discharge resistance; a voltage sensor parallel connected to the discharge resistance; and a first switch parallel connected to the discharge resistance. The apparatus may further comprise a PV panel input terminal and a second switch operatively coupling between the PV panel input terminal and the panel string. The apparatus may further comprise a PID operatively connected to the PV panel string and a PV panel, wherein the PID may comprise a "buck" type DC to DC converter. The second switch may comprise a diode. The apparatus may further comprise a second switch serially connected to the discharge resistance and the PV panel string.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1A:
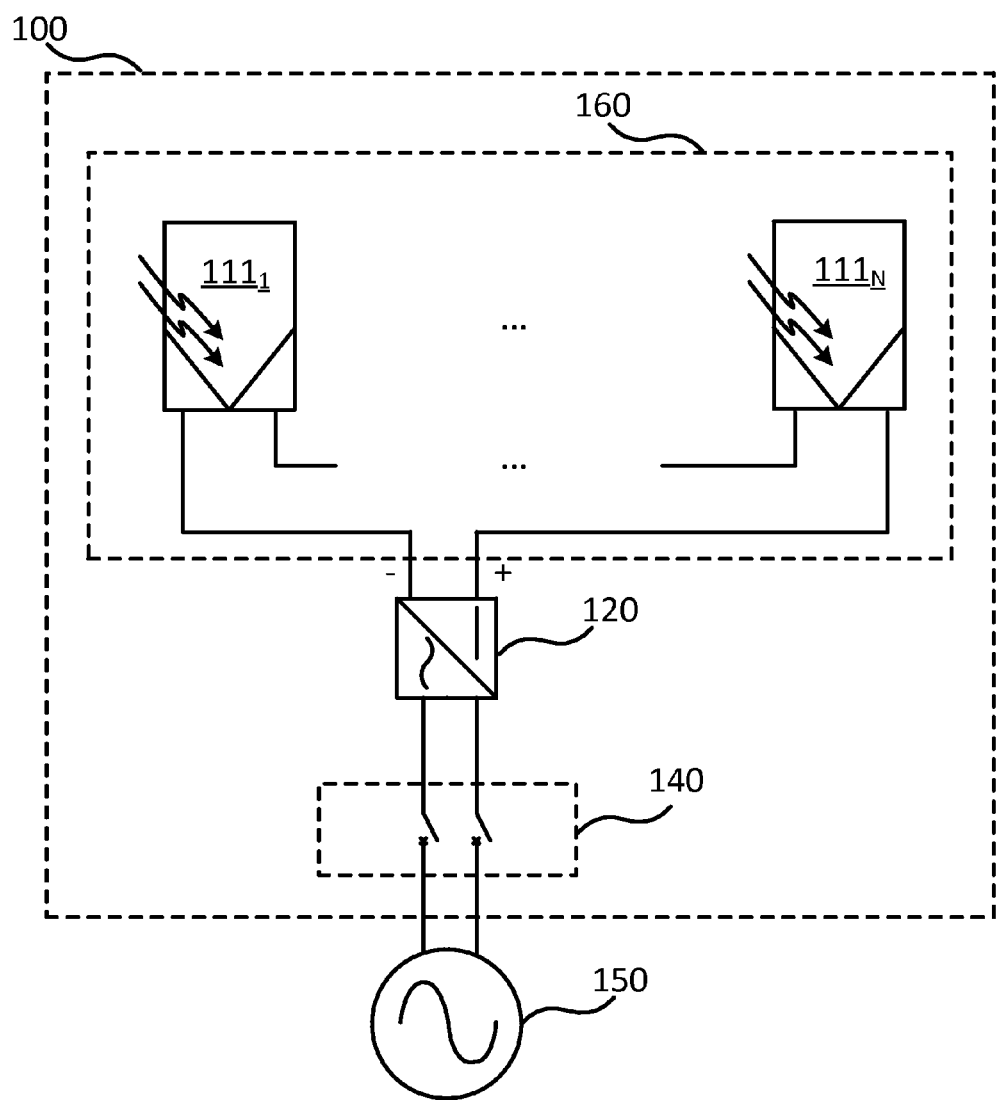
FIG. 1A illustrates a block diagram of an example grid tied PV installation according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a PV panel string continuity detection method. Referring now to the drawings, and more particularly to FIGS. 1 through 8 where similar reference characters denote corresponding features consistently throughout the figures, there are shown preferred embodiments.

FIG. 1A is a block diagram of an example grid tied PV installation 100. The example installation 100 includes PV panel string 160 operatively connected to the input of inverter 120. String inverter 120 converts the DC power of PV panel string 160 to AC power. PV panel string 160 comprises a series connection of PV panels $111_1, \ldots 111_N$. The AC output of PV panel string inverter 120 operatively connects to electrical grid 150 through grid disconnect switch 140. FIG. 1A is an example only and other arrangements are possible in accordance with the embodiments herein. For example there could be multiple PV panel strings arranged in parallel and connected to inverter 120.

Figure 1B:
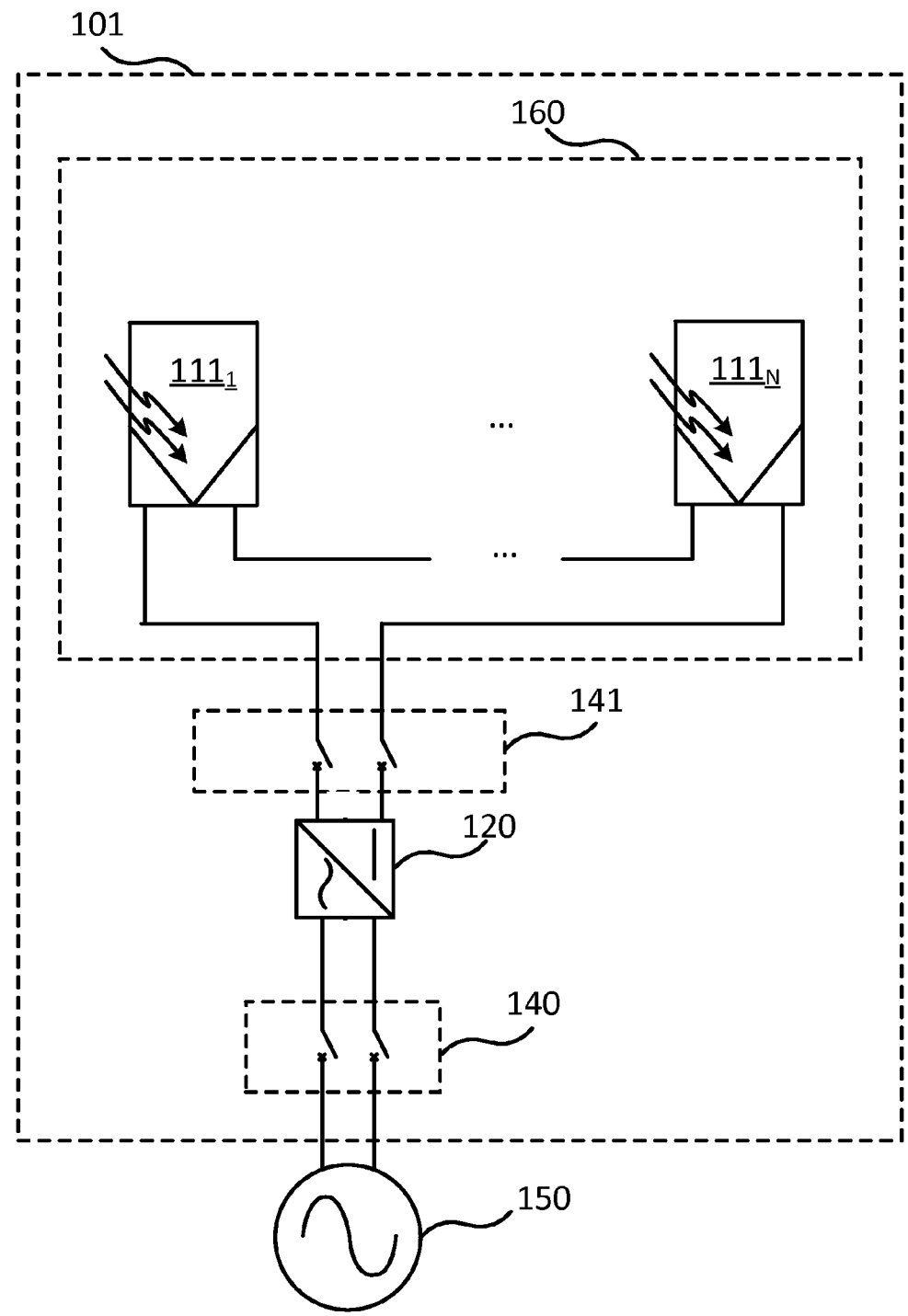
FIG. 1B illustrates a block diagram of another example grid tied PV installation according to an embodiment herein.

FIG. 1B, with respect to FIG. 1A, is a block diagram of another example grid tied PV installation 101. In example installation 101, there is DC disconnect switch 141 between PV panel string 160 and the input of inverter 120. In other embodiments additional disconnect means may be used between the PV panel string 160 and the string inverter 120 and/or between the string inverter 120 and the grid 150, including fuses for example. Additional disconnect means may provide for easier maintenance of the inverter 120. For example, in other embodiments there could be multiple PV panel strings with individual DC disconnect switches.

Again, power production by PV panels under illumination can represent a potential safety hazard. It could therefore be useful to have the PV panels in a PV installation isolate themselves from their PV panel string and not output power whenever the PV installation is disconnected from the grid.

A PV installation could disconnect from the grid for any of a number of reasons. These could include a manual disconnect for maintenance purposes and/or during an emergency such as a fire. Also, a PV installation could instead automatically disconnect due to an electrical fault on the grid. A PV installation could also be disconnected from the grid prior to its commissioning.

It could be useful if PV panels isolated themselves from their PV panel string in the event of an open circuit condition in their PV panel string. This might be caused by, for example: a physical break in the panel string; removal of one or more PV panels from the PV panel string for maintenance, repair, or replacement; theft of a panel, disconnection of the PV panel string from an inverter for inverter repair or replacement by opening of a disconnect switch; a fault in the inverter; and/or during initial PV panel installation before all PV panels are installed in a panel string.

Figure 2A:
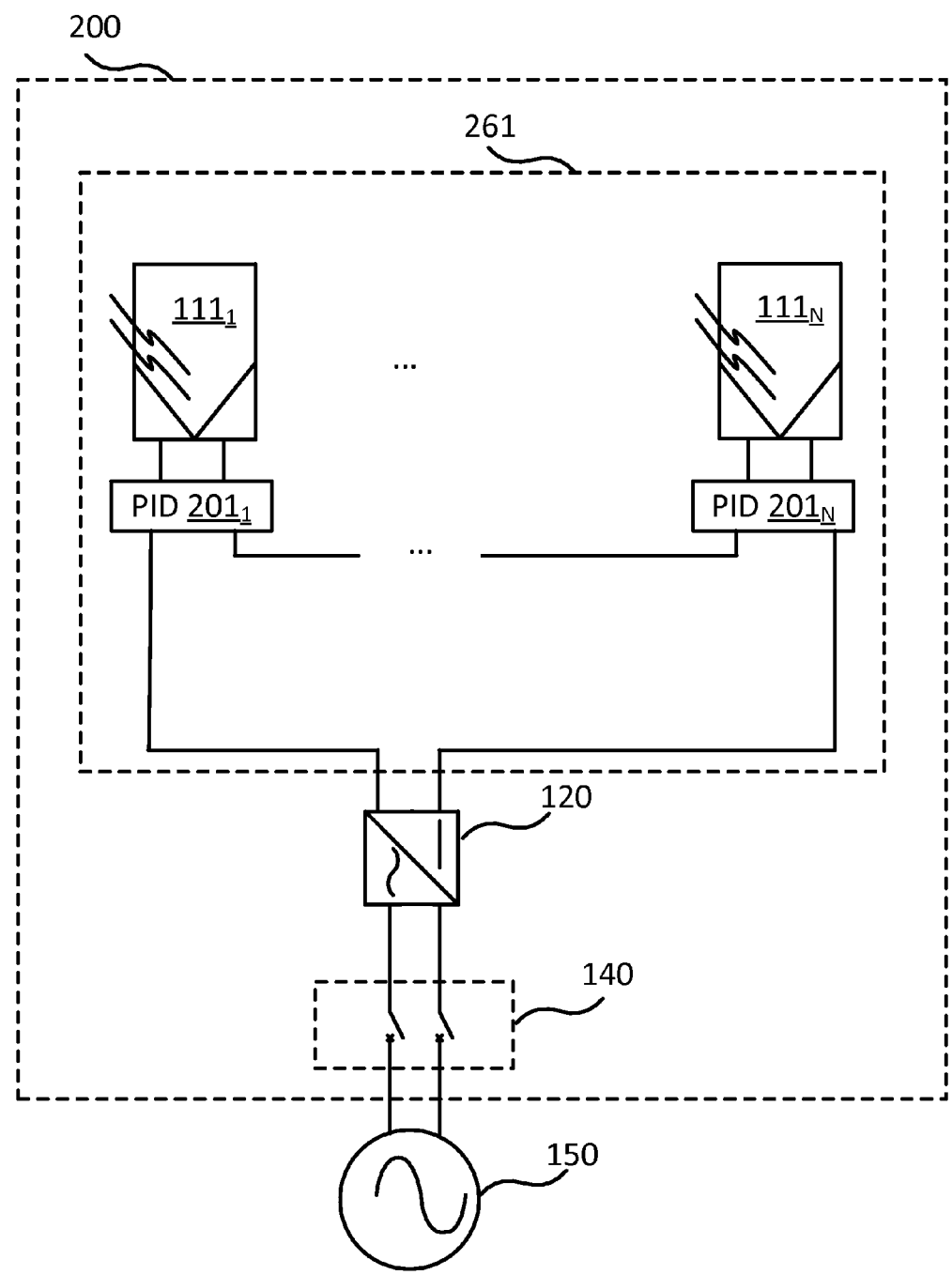
FIG. 2A illustrates a block diagram of still another example grid tied PV installation according to an embodiment herein.

FIG. 2A, with reference to FIGS. 1A and 1B, is a block diagram of another example grid tied PV installation 200 according to an embodiment herein. PV installation 200 comprises PV panel string 261 and inverter 120. PV panel string 261 comprises PV panels $111_1, \ldots 111_N$ and PIDs $201_1, \ldots 201_N$. The DC outputs of PV panels $111_1, \ldots 111_N$ respectively and operatively connect to the inputs of PIDs $201_1, \ldots 201_N$. PIDs $201_1, \ldots 201_N$ could perform a disconnect function and disconnect their respective PV panels $111_1, \ldots 111_N$ from PV panel string 261 in the event of an open circuit or high resistance condition in PV panel string 261. In one embodiment, PIDs $201_1 \ldots 201_N$ monitor the current in PV panel string 261 and disconnect their respective PV panels $111_1 \ldots 111_N$ when the PV panel string current drops below a predetermined threshold value.

An open circuit condition could be caused by, for example, removal of one or more PV panels $111_1, \ldots 111_N$, a physical break in the PV panel string 261, the opening of a switch (not shown) in the PV panel string 261, the blowing of a PV panel string fuse (not shown), and/or a fault in inverter 120.

A high resistance condition could be caused by PV panel string inverter 120 ceasing operation. PV panel string inverter 120 could cease operation due to, for example, manual disconnection of the PV installation 200 from electrical grid 150 and/or anti-islanding of inverter 120. Anti-islanding refers to the automatic disconnection of a PV installation 200 from the grid 150 when the PV installation 200 detects that the main grid generator (not shown) is no longer present. Anti-islanding prevents the creation of "power islands" on parts of the grid 150 during a power failure. If the example PV installation 200 disconnects from grid 150 by, for example, opening of grid disconnect switch 140, then the input of string inverter 120 will become high resistance and the string current will fall substantially to zero.

Figure 2B:
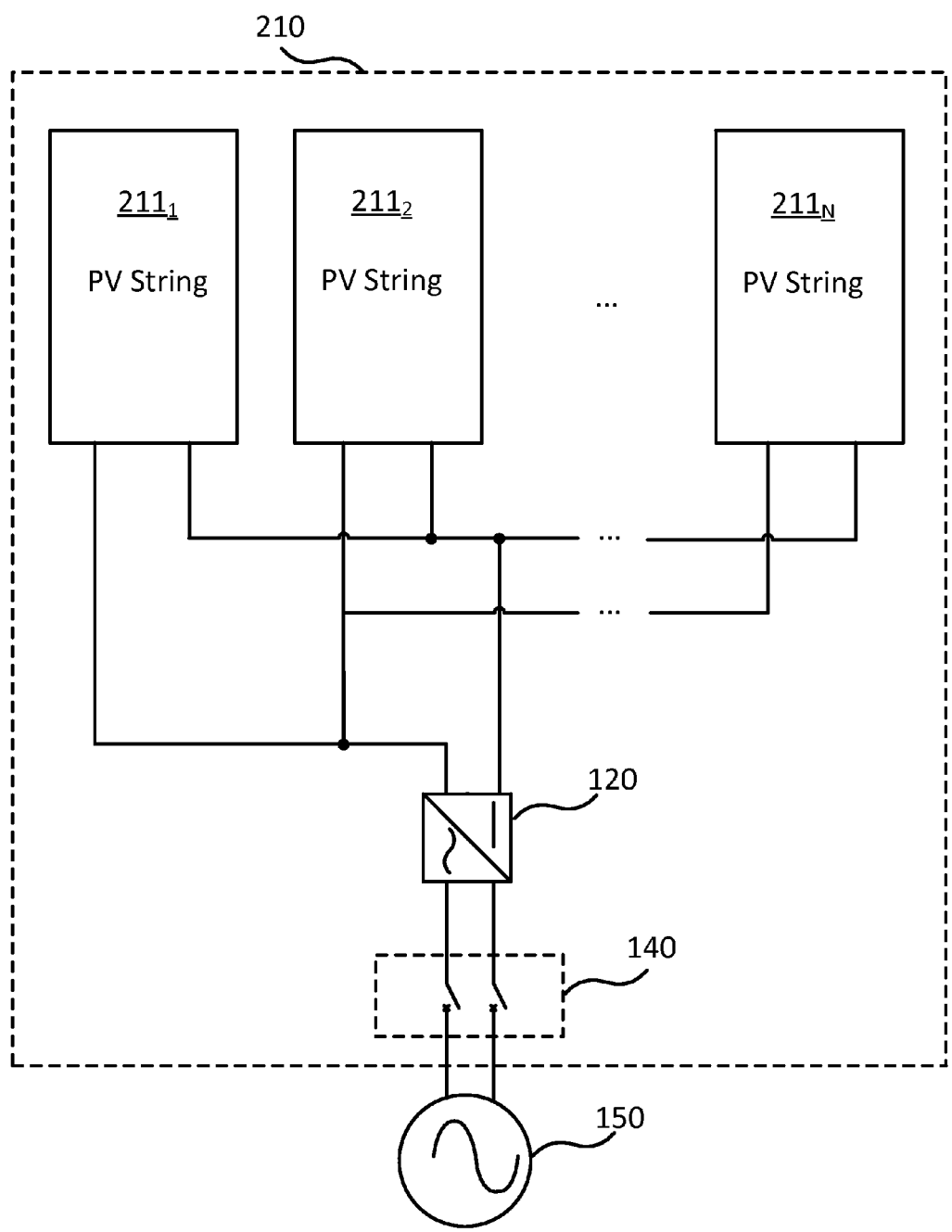
FIG. 2B illustrates a block diagram of yet another example grid tied PV installation according to an embodiment herein.

FIG. 2B, with reference to FIGS. 1A through 2A, is a block diagram of another example grid tied PV installation 210 according to an embodiment herein. In this example installation 210, PV panel strings $211_1, 212_2, \ldots 211_N$ are connected in parallel to the inputs of inverter 120. Each PV panel string $211_1, 212_2, \ldots 211_N$ comprises a series connection of PV panels and respective PIDs as shown in FIG. 2A for example.

Figure 3A:
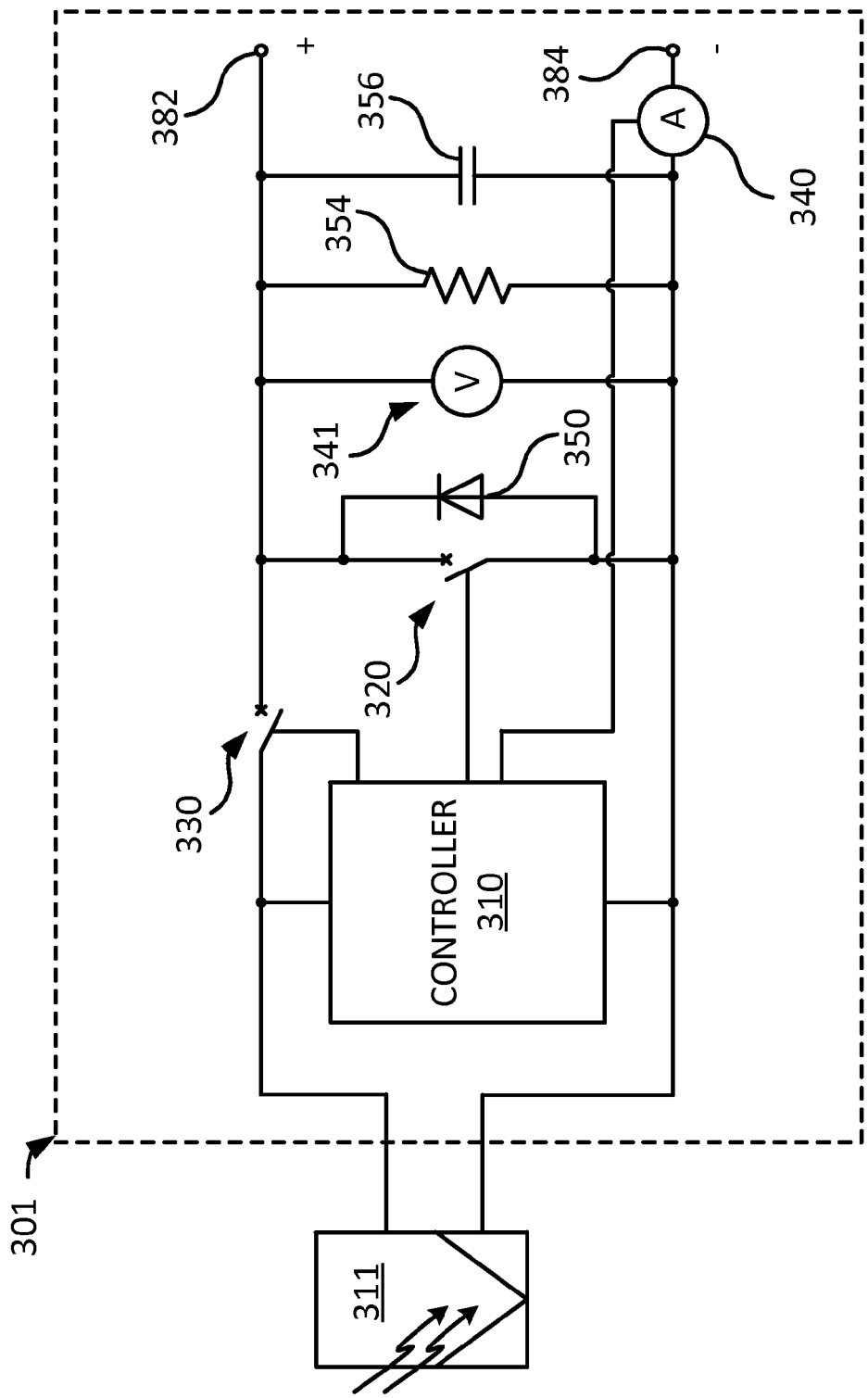
FIG. 3A is a schematic diagram of a panel interface device (PID) according to an embodiment herein.

FIG. 3A, with reference to FIGS. 1A through 2B, is a block diagram of one embodiment of a PID 301 according to an embodiment herein. PID 301 comprises controller 310, switch 320, series switch 330, current sensor 340, diode 350, discharge resistance 354, output capacitance 356, voltage sensor 341, and output terminal pair 382, 384. The input of PID 301 operatively connects to PV panel 311. PID output terminal pair 382, 384 operatively connect to the PV panel string (not shown in FIG. 3A). The output terminal pair 382, 384 comprises the points of coupling between the PID 301 and the PV panel string (not shown in FIG. 3A).

Switches 320, 330 could be implemented using any of a variety of means, including but not limited to: power Metal Oxide Semiconductor Field Effect Transistors (MOSFETs), Insulated Gate Bipolar Transistors (IGBTs), thyristors, and/or relays, for example. Diode 350 is connected in parallel with switch 320. Controller 310 controls the operation of switches 320, 330. Controller 310 draws its power from PV panel 311 and receives current and voltage measurements from current sensor 340 and voltage sensor 341, respectively. Current sensor 340 monitors the string current. Voltage sensor 341 monitors the output voltage of PID 301.

Switch 320 allows panel 311 to be bypassed in the event that it cannot match the string current. Panel 311 might not be able to match the string current if, for example, it were heavily shaded. Bypass of the panel could prevent harmful reverse bias voltages being developed across panel 311. Diode 350 allows panel 311 to be bypassed in the event that PV panel 311 cannot supply sufficient power to operate controller 310. If PV panel 311 was defective or heavily shaded, for example, it might be unable to supply sufficient power to operate controller 310. In this situation controller 310 might be unable to supply sufficient drive voltage to keep switch 320 closed. String current could, however, still bypass the panel by flowing through diode 311.

In normal operation, with PV panel 311 illuminated and producing a DC voltage, switch 320 is open and switch 330 is closed. PV panel 311 is in series with the other panels in the PV panel string (not shown in FIG. 3A) and contributes to the string voltage and current.

Figure 3B:
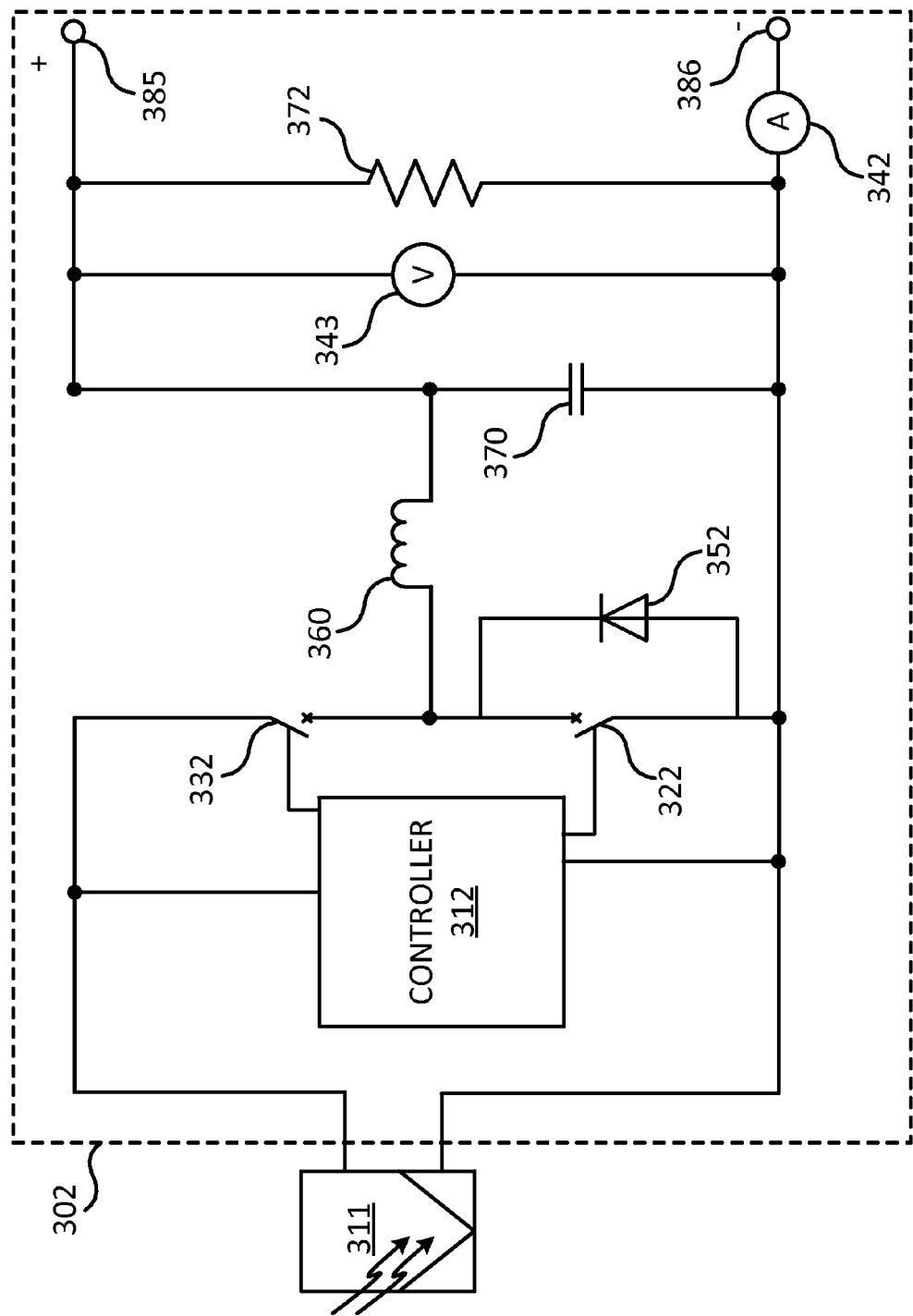
FIG. 3B a schematic diagram of another PID according to an embodiment herein.

FIG. 3B, with reference to FIGS. 1A through 3A, is a block diagram of another embodiment of a PID according to an embodiment herein. PID 302 incorporates DC power optimizer functionality in addition to disconnect functionality.

A DC power optimizer uses a DC to DC converter to maximize the power output of a PV panel 311. A DC power optimizer also matches its current output to the string current. Although such terms as optimizer, optimize, maximize, and the like are used herein, these terms are not intended to infer absolute optimality or maxima. For instance, power optimization functionality may improve performance, but might not necessarily achieve theoretical maximum or optimal power production or output.

PID 302, in the example shown in FIG. 3B, comprises controller 312, switches 322, 332, inductor 360, output capacitance 370, current sensor 342, diode 352, discharge resistance 372, voltage sensor 343, and output terminals 385, 386. The input of PID 302 operatively connects to PV panel 311. Output terminal pair 385, 386 operatively connect to the PV panel string (not shown in FIG. 3B). The output terminal pair 385, 386 comprises the points of coupling between the PID 302 and the PV panel string (not shown in FIG. 3B). In one example embodiment, discharge resistance 372 has a value of 15 k-ohms, output capacitance 370 has a value of 10 µF, inductor 360 has a value of 5.6 µH, current sensor 342 is a 2 milli-ohm resistor, and the MPP voltage of panel 311 is 33 V and its MPP current is 10 A. However, the embodiments herein are not restricted to these example values.

PID 302 is of a "buck" type DC to DC converter configuration. A buck type DC to DC converter converts a DC input voltage at one level to a DC output voltage at another, lower level. Other types of DC to DC converter topologies are possible in accordance with the embodiments herein.

When PV panel 311 is illuminated and there is string current flowing, PID 302 performs a voltage conversion and power optimization operation. The operation is controlled by controller 312. Switches 322, 332 are switched with a frequency "f" and operate in a complementary fashion, such that when one switch is open (ON) the other switch will be closed (OFF).

When switch 332 is closed and switch 322 is open, current from PV panel 311 flows into inductor 360, storing energy therein. When switch 332 is opened and switch 322 is closed, the voltage across the inductor 360 reverses and it sources current into output capacitance 370 and the panel string. The duty cycle of PID 302 ($D_{BUCK}$) is defined as the ratio of the ON time of switch 332 to the switching period T and is normally expressed as a percentage. The duty cycle could range from 0 to 100%. For example, if switch 332 is ON for 70% of the switching period then the duty cycle is 70%. The relationship of output voltage ($V_{BUCK}$) of PID 302 to its input voltage ($V_{IN}$) depends on the duty cycle and is given by the equation:

$$V_{BUCK} = D_{BUCK} V_{IN}$$

$V_{BUCK}$ is defined as the voltage across terminal pair 385, 386 and $V_{IN}$ is defined as the voltage of PV panel 311. The relationship of the output current ($I_{OUT}$) of PID 302 to its input current ($I_{IN}$) also depends on the duty cycle and is given by the equation:

$$I_{OUT}=I_{IN}/D_{BUCK}$$

Switches 322, 332 could be implemented using any of a variety of means, including but not limited to: power MOSFETs, IGBTs, thyristors, and/or relays, for example. Diode 352 is in parallel with switch 322. Diode 352 allows string current to flow in the event that PV panel 311 cannot supply sufficient power to operate controller 312 and keep switch 322 closed.

Disconnect Operations

Referring to FIG. 2A, in the event of the occurrence of a PV panel string disconnect condition, PIDs 201, ... $201_N$ disconnect their respective PV panels $111_1$, ... $111_N$ from PV panel string 261. A PV panel string disconnect condition could be an open circuit or high resistance condition on PV panel string 261.

An open circuit or high resistance condition in a PV panel string could result in the loss or substantial reduction in the PV panel string current. In PID 301 of FIG. 3A, a loss or reduction in PV panel string current could be detected by controller 310 using current sensor 340. Similarly, in PID 302 of FIG. 3B a loss or reduction in PV panel string current could be detected by controller 312 using current sensor 342. In one embodiment, a PV panel string current of less than 200 mA is interpreted as a PV panel string disconnect condition and triggers a disconnect of PV panel 311 by PID 301, 302. In PID 301 of FIG. 3A, controller 310 opens switch 330, disconnecting PV panel 311 from the PV panel string (not shown in FIG. 3A) and interrupting the flow of power. Similarly, in PID 302 of FIG. 3B, controller 312 opens switch 332, disconnecting PV panel 311 from the PV panel string (not shown in FIG. 3B).

Reconnect Operations

After a PID has isolated its PV panels from the panel string, it could check to determine whether the disconnect condition has been resolved and whether its PV panel can be reconnected to the PV panel string to provide power. A variety of reconnect techniques are possible such as the ones described in U.S. patent application Ser. No. 13/840,162 entitled "INTELLIGENT SAFETY DISCONNECT SWITCHING" and in U.S. patent application Ser. No. 14/073,473 entitled "STRING CONTINUITY MONITORING" the complete disclosures of which, in their entireties, are herein incorporated by reference.

Referring to FIG. 2A, after PID $201_1$, ... $201_N$ has disconnected PV panel $111_1$, ... $111_N$ from PV panel string 261 due to a disconnect condition, PID $201_1$, ... $201_N$ could check that the PV panel string has continuity (is physically continuous and connected to the input of inverter 140). The input capacitance of a string inverter 120 varies by manufacturer and power capacity but is normally large and could be in the range of approximately 50 µF to 5 mF.

In some cases, after a string inverter has stopped converting power it cannot immediately resume converting power. There could be a mandatory start-up period after the inverter's grid connection has been restored or the inverter's input voltage has returned to a valid operating value before the inverter can start to draw DC power at its input. A string inverter could be unable to start operation and draw DC current from the PV panel string until this start-up period expires. The start-up period could be on the order of approximately five minutes. Therefore, even if a PV panel string has physical continuity and is connected to the input of its string inverter there could be a high resistance in the string and no DC current until the inverter's start-up period expires.

In addition, a string inverter could have a minimum input voltage requirement below which it will not operate and draw DC current at its input. Therefore, it could be beneficial for a PID to keep its panel connected to its PV panel string despite there being high resistance in the string and the absence of DC current for a time on the order of at least the string inverter's start-up period. For example, after PID $201_1$, ... $201_N$ has reconnected PV panel $111_1$, ... $111_N$ to PV panel string 261 it could be beneficial for it to remain connected to allow string inverter 120 sufficient time to start even if there is no PV panel string current flowing. However, if all of PIDs $201_1$, ... $201_N$ have reconnected their respective PV panels $111_1$, ... $111_N$ to PV panel string 261 the PV panel string voltage at the input of string inverter 120 could be several hundred volts. If the disconnect condition occurred from a physical break in PV panel string 261 by, for example, removal of a panel, disconnection or severing of a cable, etc., serious injury or damage could result. Accordingly, the embodiments herein provide a technique to continually monitor the continuity of a PV panel string (e.g., verify that a PV panel string is still physically continuous and connected to the inverter's input) while waiting for the string inverter to start, which could improve the safety of a PV panel array.

Figure 4A:
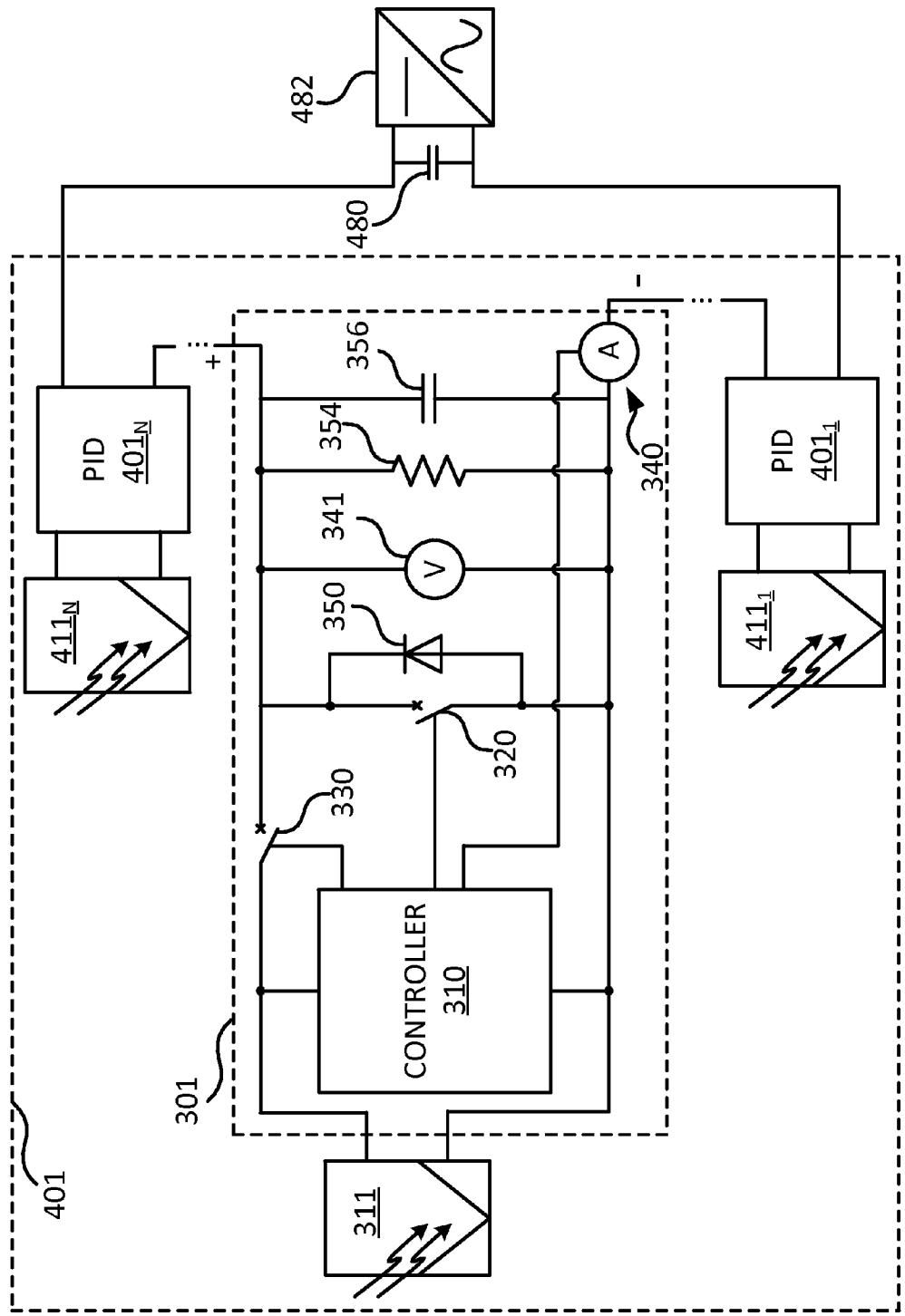
FIG. 4A illustrates a block diagram of a PV panel string operatively connected to a string inverter according to an embodiment herein.

FIG. 4A, with reference to FIGS. 1A through 3B, is a block diagram of a PV panel string 401 operatively connected to a string inverter 482 according to an embodiment herein. Although the input capacitance of inverter 482 is represented by capacitance 480 in FIG. 4A it should be understood that it is a part of inverter 482 and is not separate from it. In one embodiment, capacitance 480 has a value of 100 µF. PV panel string 401 comprises PV panels 311, $411_1$, ... $411_N$ and PIDs 301, $401_1$, ... $401_N$. PIDs 301, $401_1$, ... $401_N$ are serially connected. PIDs $401_1$, ... $401_N$ could have a similar configuration to PID 301. In one embodiment PIDs $401_1$, ... $401_N$ are identical to PID 301 and have a discharge resistance and an output capacitance at their output terminals of the same values as discharge resistance 354 and output capacitance 356 of PID 301.

Figure 4B:
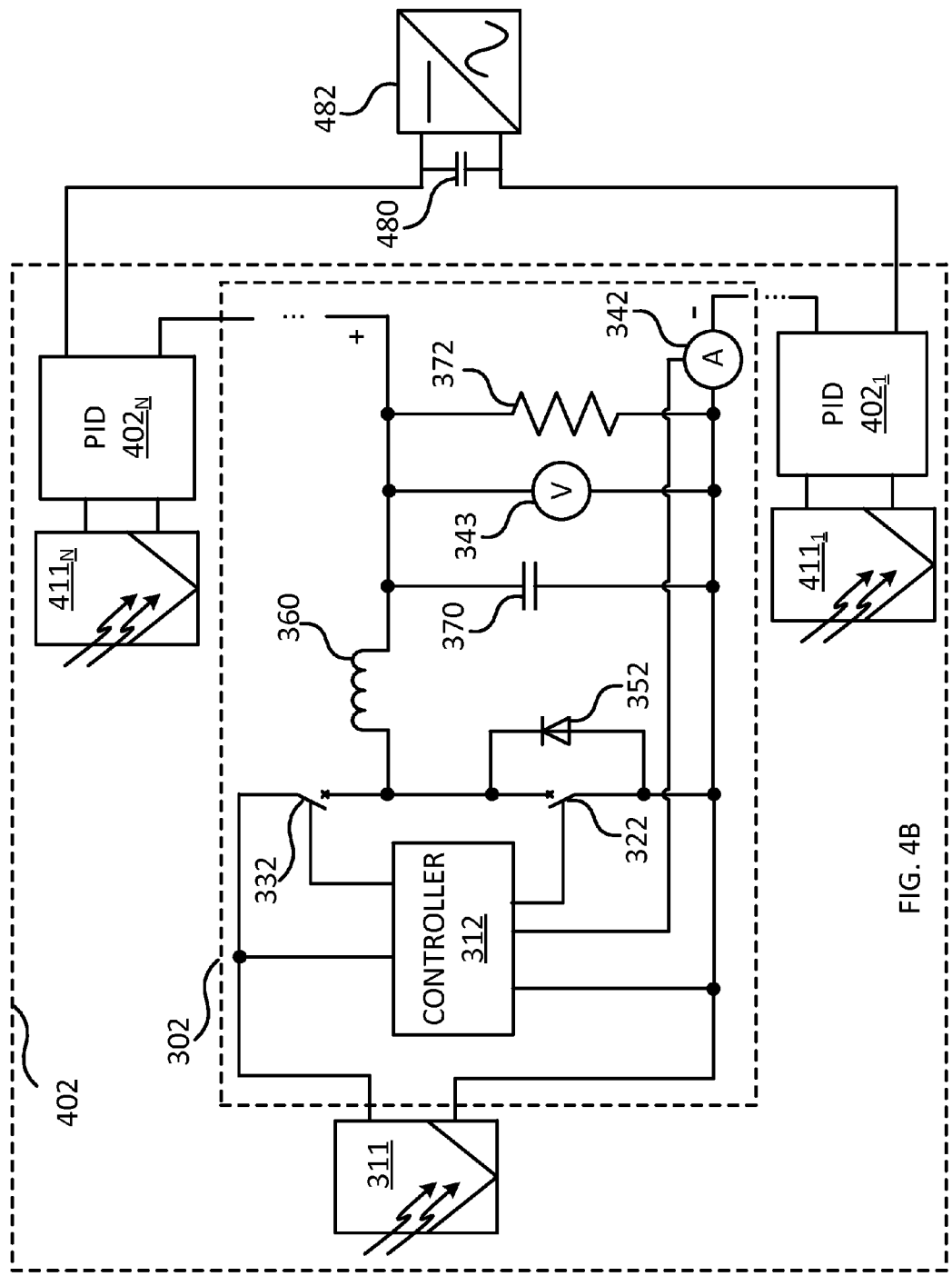
FIG. 4B illustrates a block diagram of another PV panel string operatively connected to a string inverter according to an embodiment herein.

FIG. 4B with reference to FIGS. 1A through 4A, is a block diagram of a PV panel string 402 operatively connected to a string inverter 482 according to an embodiment herein. Although the input capacitance of inverter 482 is represented by capacitance 480 in FIG. 4B it should be understood that it is a part of inverter 482 and is not separate from it. In one embodiment capacitance 480 has a value of 100 µF. Panel string 402 comprises PV panels 311, $411_1$, ... $411_N$ and PIDs 302, $402_1$, ... $402_N$. PIDs 302, $402_1$, ... $402_N$ are serially connected. PIDs $402_1$, ... $402_N$ could have a similar configuration to PID 302. In one embodiment, PIDs $401_1$, ... $401_N$ are identical to PID 302 and have a discharge resistance and capacitance at their output terminals of the same values as discharge resistance 372 and output capacitance 370 of PID 302.

Figure 5A:
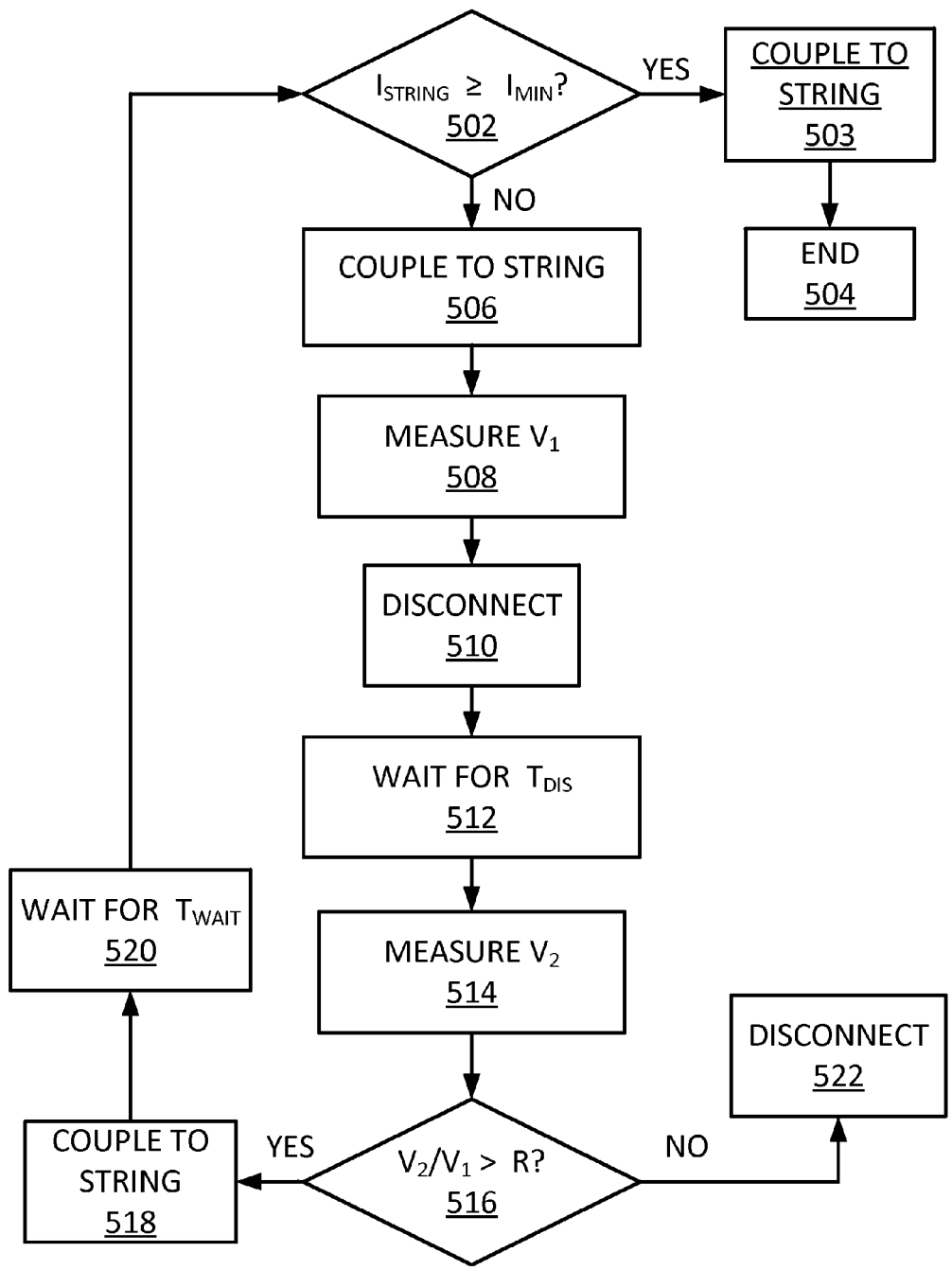
FIGS. 5A and 5B are flow diagrams illustrating PV panel string continuity monitoring methods performed by a PID according to an embodiment herein.

FIG. 5A, with reference to FIGS. 1A through 4B, is a flow diagram of a string continuity monitoring method performed by a PID that has disconnected from a panel string. At step 502, the PID determines if the string current is less than a minimum value ($I_{MIN}$). In one embodiment, referring to FIG. 4A, controller 310 receives a current measurement from current sensor 340 and compares the measured value to a minimum value. In one example embodiment the minimum value is 350 mA. In another embodiment, referring to FIG. 4B, controller 312 receives a current measurement from current sensor 342 and compares the measured value to a minimum value. If the string current is greater or equal to the minimum value (YES at step 502), then the string is determined to have continuity, the PV panel is operatively coupled to the PV panel string permanently at 503 and the continuity monitoring method ends at step 504. Permanently in this context means that the PV panel remains operatively coupled to the PV panel string until the next PV panel string disconnect condition occurs. If the string current is less than $I_{MIN}$ (NO at step 502), then the PID operatively couples the PV panel to the PV panel string at step 506. In one embodiment, referring to FIG. 4A controller 310 of PID 301 closes switch 330 and output capacitance 356 is charged to the output voltage of PV panel 311 ($V_{PV}$) by panel 311. In one example embodiment, $V_{PV}$ is 33 V. If there is continuity in string 401 and string 401 is connected to inverter 482, then capacitance 480 of inverter 482 will also be incrementally charged by a voltage of $V_{PV}$. Remaining PIDs $401_1, \ldots 401_N$ in string 401 could have capacitances and discharge resistances connected at their outputs however their capacitances will not be charged since they are shunted by their discharge resistances. Switch 330 of PID 301 could have a very low ON resistance (milli-ohms) to reduce power losses during normal operation of the PID. The charging current to charge input capacitance 480 could therefore be large and could cause damage.

In one embodiment, the charging current is limited by gradually increasing the duty cycle of switch 330. Switch 330 is switched to repetitively close and open with a period of $T_{SW}$, a switch ON time of $T_{PULSE}$ and a duty cycle of D. The duty cycle is the ratio of $T_{PULSE}/T_{SW}$. The duty cycle is gradually increased to control the current through the switch. In one example embodiment, the duty cycle is increased from 0 to 100% over 50 milli-seconds.

In another embodiment, referring to FIG. 4B, controller 312 of PID 302 switches switch 332 with a switching frequency "$f_{BUCK}$" and a duty cycle $D_{BUCK}$ to produce a voltage $V_{BUCK}=D_{BUCK}V_{PV}$. In one example embodiment the switching frequency is 200 kHz. Output capacitance 370 is charged to $\backslash T_{out}$ by PID 302. If there is continuity in string 402 and string 402 is connected to inverter 482 then capacitance 480 of inverter 482 will also be incrementally charged by a voltage of $V_{BUCK}$. Again, to prevent too large a charging current the duty cycle of switch 332 could be gradually increased. In one example embodiment the duty cycle increases from 0 to 75% over a time of 50 milli-seconds.

Again with reference to FIG. 5A, at step 508 the voltage at the output of the PID ($V_1$) is measured. In one embodiment controller 310, 312 measure the output voltage of PID 301, 302 using voltage sensor 341, 343, respectively. At step 510 the PID disconnects the PV panel from the panel string. In one embodiment controller 310, 312 of PID 301, 302 opens switch 330, 332, respectively. At step 512 the PID waits for a discharge period of duration $T_{DIS}$ during which the PID output voltage could decrease. In one example embodiment $T_{DIS}$ is 100 milli-seconds. In one embodiment, discharge resistance 354, 372 begins to discharges output capacitance 356, 370 in PID 301, 302. If there is continuity in string 401, 402 then input capacitance 480 of inverter 482 will support the voltage across output capacitance 356, 370 during the discharge period and cause it to decrease at a lower rate than if there was no continuity in the string.

At step 514 the voltage at the output of the PID after the discharge period ($V_2$) is measured. In one embodiment, controller 310, 312 measures the output voltage of PID 301, 302 using voltage sensor 341, 343, respectively. The value of $V_2$ depends on the string continuity. If there is no string continuity, then $V_2$ is given by the formula:

$$V_2 = V_1 e^{-T_{DIS}/R_{PID}C_{PID}} \quad (1)$$

where $C_{PLD}$ is the PID output capacitance and $R_{PID}$ is the PID output resistance. For example, in PID 301, 302 $C_{PLD}$ is the value of capacitance 356, 370 and $R_{PID}$ is the value of discharge resistance 354, 372. If the string does have continuity and is connected to a string inverter then $V_2$ is given by the formula:

$$V_2 = V_1 e^{-T_{DIS}/MR_{PID}C_{INV}} \quad (2)$$

where $C_{INV}$ is the string inverter input capacitance and M is the number of PIDs in the string and all PIDs have an identical output resistance of $R_{PID}$. For example, in string 401, 402 $C_{INV}$ is the value of capacitance 480, the number of PIDs is equal to N+1 and $R_{PID}$, is the value of resistance 354, 372. The above equation is an approximation and is valid when $C_{INV} \gg C_{PID}$.

At step 516 the ratio of $V_2$ to $V_1$ is compared to a threshold value (R). The value of R could represent the minimum possible discharge ratio that would occur if the string is continuous and connected to the inverter input capacitance and could be calculated using equations (1) and (2). In one embodiment R is given by the equation:

$$R = e^{-T_{DIS}/MR_{PID}C_{INV}} \quad (3)$$

In one example embodiment R is equal to 0.23.

If the ratio of $V_2$ to $V_1$ is greater than R (YES at step 516) then the string is determined to have continuity and the PV panel is operatively coupled to the string at step 518. At step 520 the PID waits for a time $T_{WAIT}$. After a time of $T_{WAIT}$ the string current is again evaluated at step 502. $T_{WAIT}$ could represent a safe time interval between string continuity checks. In one example embodiment $T_{WAIT}$ is a random value between 3 and 8 seconds. If the ratio of $V_1$ to $V_2$ is not greater than R at (NO at step 516) then the string is deemed to not have continuity and the PID disconnects from the string at step 522.

Figure 5B:
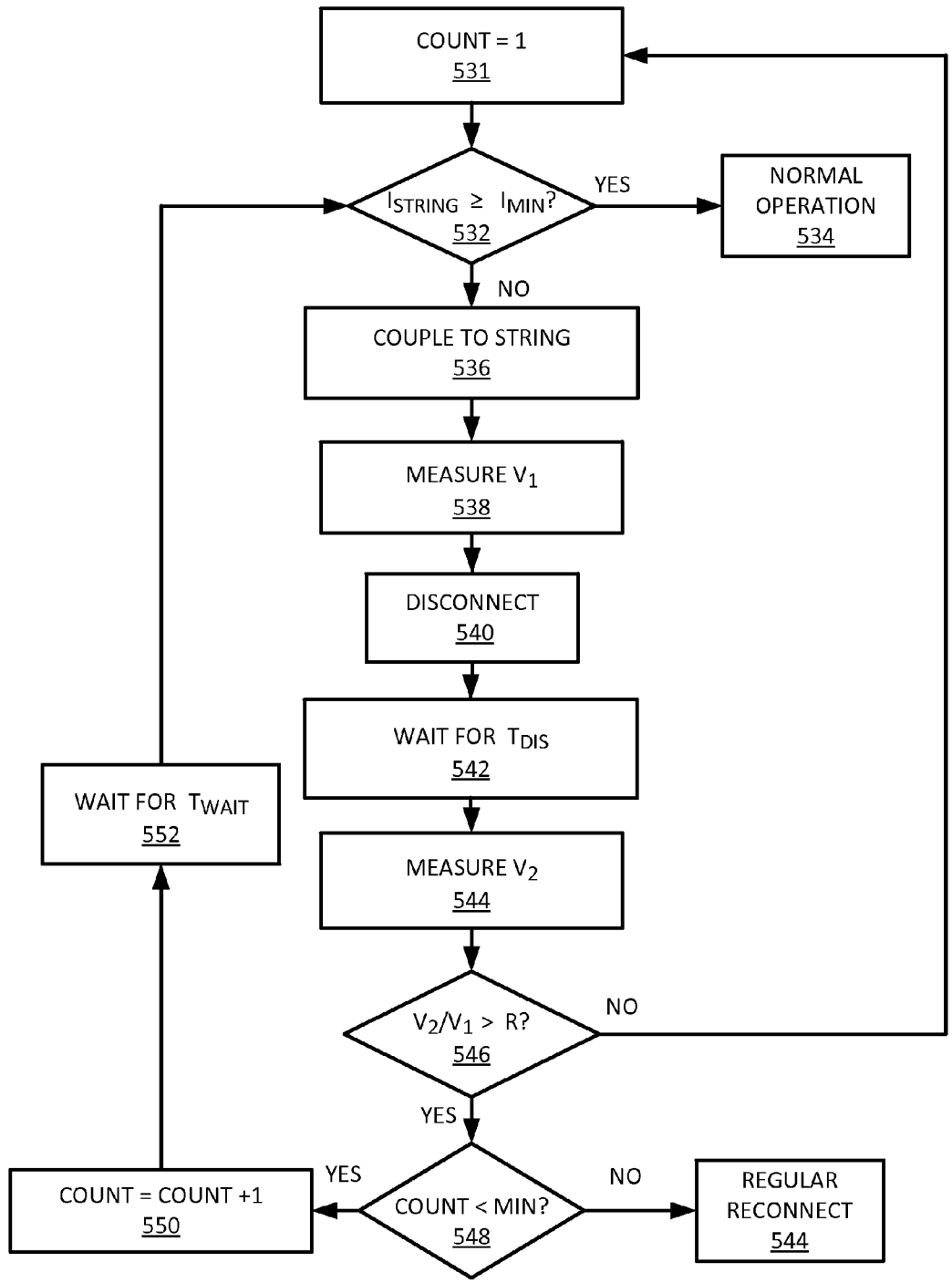

More elaborate string continuity monitoring methods based on this type of discharge ratio measurements are also possible. For example, it could be beneficial for a PID to perform a minimum number of discharge ratio measurements and only couple to the string if a minimum number of consecutive discharge ratio measurements are all greater than the threshold value R (indicating string continuity). This could prevent a single erroneous discharge ratio measurement causing a PV panel to be operatively coupled permanently to and powering a PV panel string which did not have continuity. It could be beneficial to not have the PV panel operatively coupled to the PV panel string during the waiting periods between the minimum required number of consecutive discharge ratio measurements. It could be beneficial for the PV panel to be operatively coupled to the PV panel string over the waiting period between discharge ratio measurements only after a minimum number of consecutive discharge ratio measurements have all been greater than the threshold value R, showing continuity in the string and the presence of the inverter. FIG. 5B is a flow diagram of this more elaborate string continuity monitoring method. At 531 a discharge counter (COUNT) is initialized to one. At 532 the PID determines if the string current is less than a minimum value ($I_{MIN}$). If the string current is greater or equal to the minimum value (YES at 532) then the string is determined to have continuity and normal operation resumes at 534. If the string current is not greater than or equal to $I_{MIN}$ (NO at 532) then the PID operatively couples the PV panel to the PV panel string at 536. At 538 the voltage at the output of the PID ($V_1$) is measured. At 540 the PID disconnects the PV panel from the panel string. At 542 the PID waits for a discharge period of duration $T_{DIS}$. At 544 the voltage at the output of the PID ($V_2$) is measured. At 546 the ratio of $V_2$ to $V_1$ (the discharge ratio) is compared to a discharge ratio threshold (R). If the ratio of $V_2$ to $V_1$ is greater than R (YES at 546) then the discharge count is compared to a minimum required number of consecutive discharge ratio measurements above the discharge threshold (MIN) at 548. If the discharge count is less than the minimum required number of consecutive discharge measurements above the discharge threshold (YES at 548) then the discharge count is incremented at 550 and the PID waits for waiting period $T_{WAIT}$ at 552. The PID is not connected to the string during this waiting period so that in the event of an erroneous discharge ratio measurement the string is not powered and safety could be increased. However, since the PV panel is not operatively coupled to the PV panel string the inverter cannot start operation during this waiting period and is unlikely to start before the minimum required number of consecutive discharge ratio measurements above the discharge threshold have been achieved. At the end of the waiting period the string current is again compared to the minimum current ($I_{MIN}$) at 532.

If the discharge count is not less than MIN (NO at 548) then a regular string continuity monitoring operation begins at 554. A regular string continuity monitoring operation could be as described in FIG. 5A. It could involve repetitive discharge ratio measurements with the PV panel operatively coupled to the inverter between discharge measurements which could allow the inverter to start operation. In one embodiment the required minimum number of consecutive discharge measurements above the discharge threshold is five, the waiting period between discharge ratio measurements is a random value between 10 and 20 seconds, the discharge period is 100 mS and the discharge ratio threshold is 0.23.

Figure 6B:
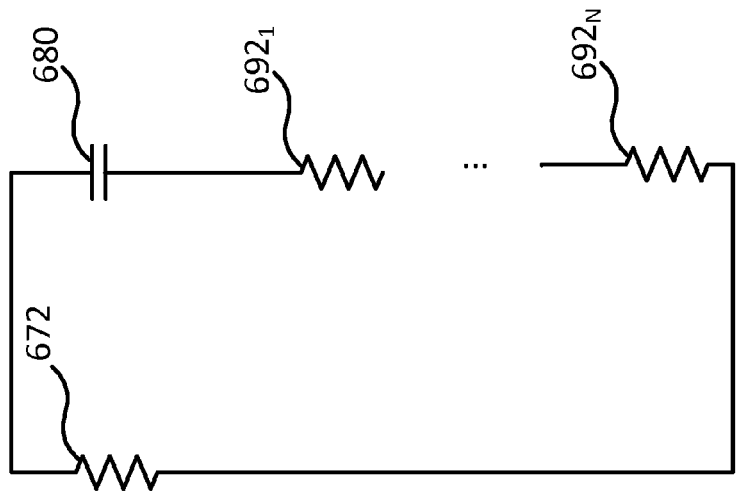
FIG. 6B illustrates a schematic diagram of an approximate equivalent circuit of a PID connected to a PV panel string and a string inverter according to an embodiment herein.
Figure 6A:
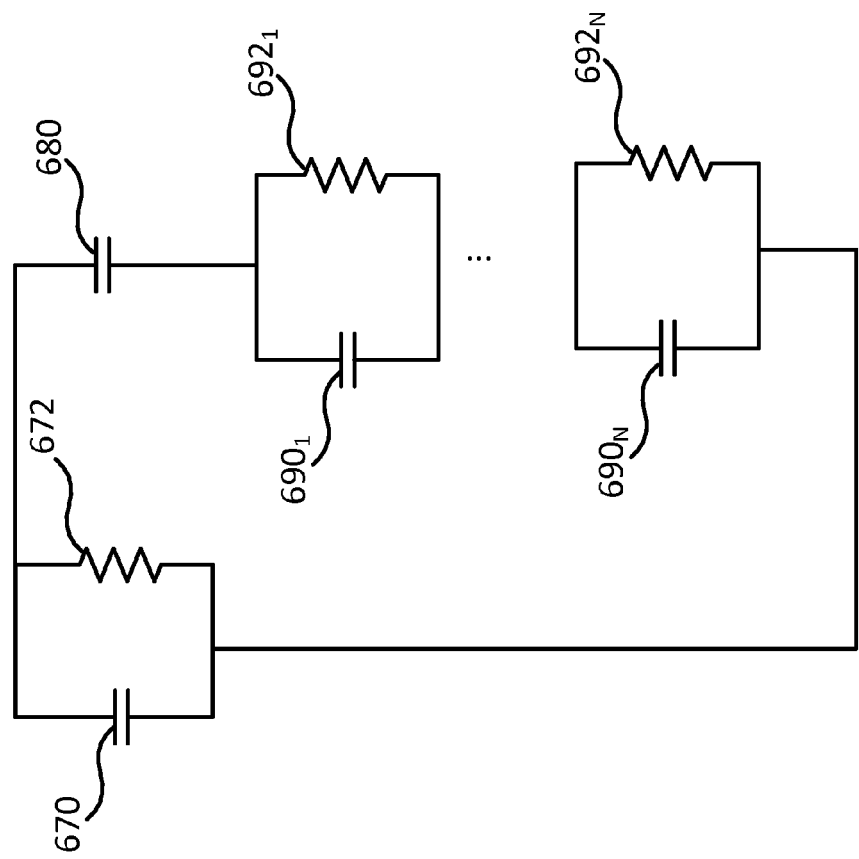
FIG. 6A illustrates a schematic diagram of an equivalent circuit of a PID connected to a PV panel string and a string inverter according to an embodiment herein.

FIG. 6A, with reference to FIGS. 1A through 5B, is a schematic diagram of an equivalent circuit of a PID connected to a string and a string inverter. The output resistance and capacitance of the PID is represented by resistance 672 and capacitor 670. The inverter capacitance is represented by capacitance 680 and the output resistance and capacitance of the "N" other PIDs in the string are represented by resistors $692_1, \ldots 692_N$ of identical value and capacitances $690_1, \ldots 690_N$ of identical value. FIG. 6B, with reference to FIGS. 1A through 6A, is a schematic diagram of an approximate equivalent circuit of a PID connected to a string and a string inverter. FIG. 6B is appropriate when the inverter capacitance is more than ten times the PID output capacitance.

Figure 7:
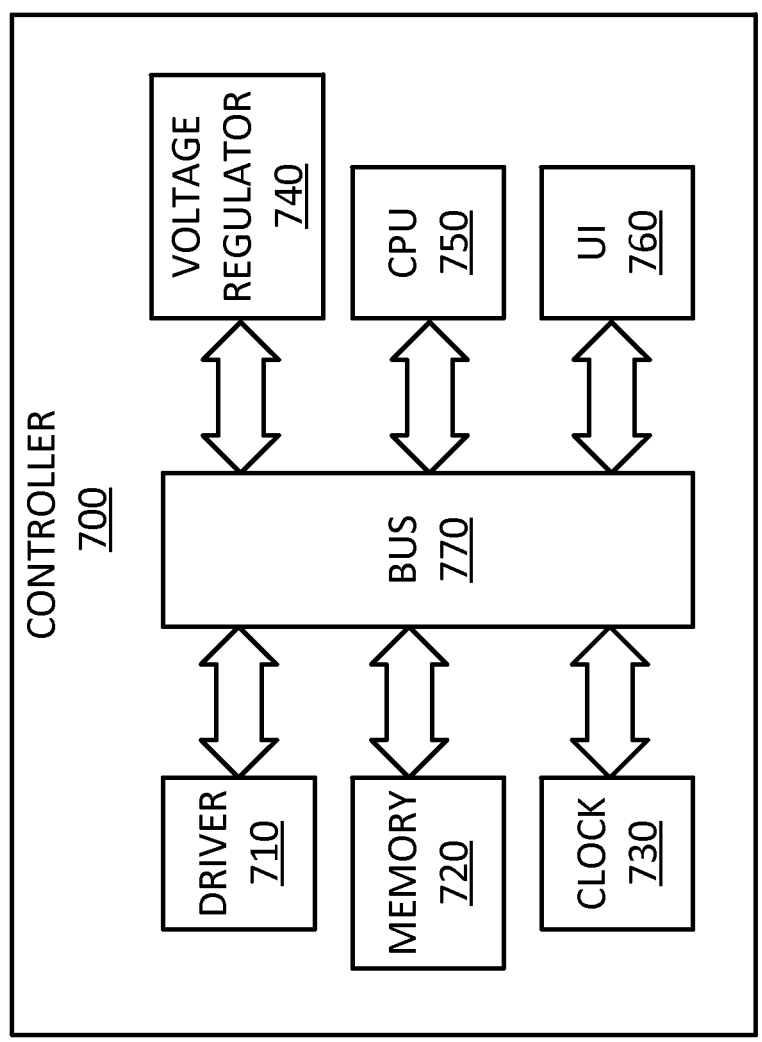
FIG. 7 illustrates a block diagram of a PID controller according to an embodiment herein.

FIG. 7, with reference to FIGS. 1A through 6, is a block diagram of one embodiment of a PID controller 700 according to an embodiment herein. Controller 700 could be used for controller 310, 312 in accordance with the embodiments herein. Controller 700 comprises driver 710, memory 720, clock 730, voltage regulator 740, central processing unit (CPU) 750, user interface (UI) 760, and control and data bus 770. Voltage regulator 740 converts the variable PV panel output voltage to a constant controller supply voltage in an embodiment. Driver 710 supplies switch drive signals to switches 320, 330, 322, 332 to control their respective opening and closing. Firmware for the operation of the controller 700 is stored in memory 720. In one embodiment, memory 720 comprises non-volatile memory such as Flash, Electrically Erasable Programmable Read Only Memory (EEPROM), EPROM, ROM, etc. The firmware is executed on CPU 750. Clock 730 controls the internal timing of the operation of the controller 700. UI 760 indicates the status of a PID to a user. Control and data bus 770 interconnects these components of the controller 700 with each other as shown, in one embodiment herein.

It could be that power dissipation from the flow of current in discharge resistances 356, 357 of PID 301, 302 during normal operation (when the PID is not performing a discharge ratio string continuity monitoring operation) is unacceptably high in some applications. In those applications it could be beneficial to place a switch in series with the discharge resistance to reduce power dissipation.

Figure 8:
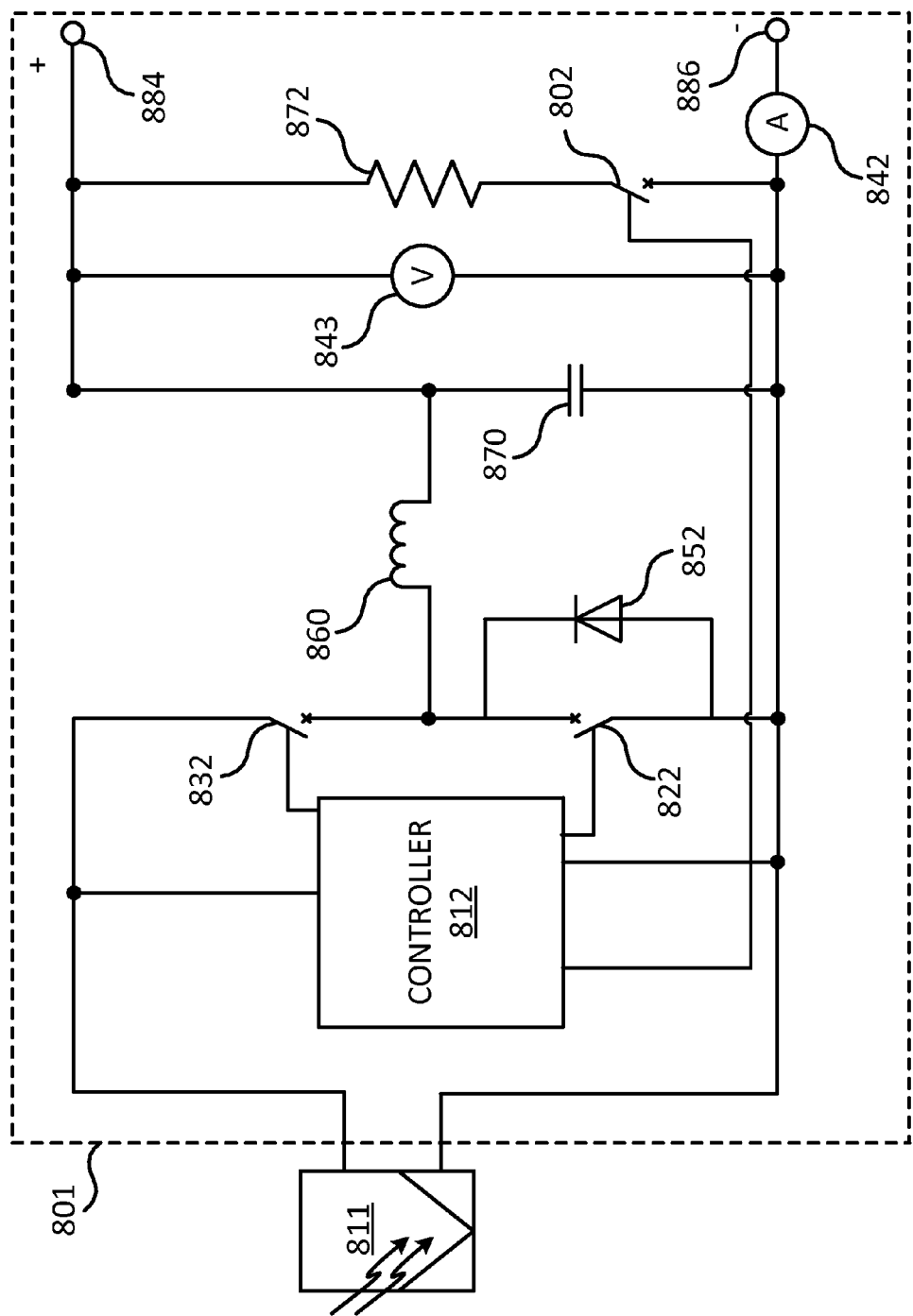
FIG. 8 is a schematic diagram of another panel interface device (PID) according to an embodiment herein.

FIG. 8, with reference to FIGS. 1A through 7, is a schematic diagram of an example PID with reduced power dissipation. PID 801 comprises controller 812, switches 822, 832, inductor 860, output capacitance 870, current sensor 842, diode 852, discharge resistance 872, discharge switch 802, voltage sensor 843, and output terminals 884, 886. The input of PID 801 operatively connects to PV panel 811. Output terminal pair 884, 886 operatively connects to the PV panel string (not shown in FIG. 8). The output terminal pair 884, 886 comprises the points of coupling between the PID 801 and the PV panel string (not shown in FIG. 8). In some circumstances, one may not want to take the power penalty associated with continuous power dissipation through discharge resistance 872 in the PID 801, which is why switch 802 is included in PID 801. In one example embodiment, discharge resistance 872 has a value of 15 k-ohms, output capacitance 870 has a value of 10 µF, inductor 860 has a value of 5.6 µH, current sensor 842 is a 2 milli-ohm resistor, and the MPP voltage of panel 811 is 33 V and its MPP current is 10 A. However, the embodiments herein are not restricted to these example values.

PID 801 is of a "buck" type DC to DC converter configuration and performs voltage conversion and MPP tracking similarly to PID 302 of FIG. 3B. In normal operation discharge switch 802 is open, no current flows in discharge resistance 872 and there is no power dissipated in discharge resistor 872. During a discharge ratio string continuity monitoring operation controller 812 closes switch 802. When the discharge ratio string continuity monitoring operation finishes controller opens switch 802. For example, referring to FIG. 5A switch 802 could be closed at 506 and opened at 504. Referring to FIG. 5B, switch 802 could be closed at 536.

In accordance with the embodiments herein, utilizing a discharge resistance (e.g., discharge resistance 354, 372, 872) is uncommon in power applications/configurations due to the potential degradation of performance as a result of power loss caused by the discharge resistance. Accordingly, the embodiments herein are utilizing the discharge resistance 354, 372, 872 in order to perform a discharge measurement, which is contrary to industry practices.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. For example, it should also be appreciated that the embodiments disclosed herein are not necessarily restricted to single PV panel string implementations. Accordingly, multiple PV panel strings could be connected in parallel to the same inverter, as shown in FIG. 2B. Moreover, it is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the description herein.

What is claimed is:

1. A method for determining continuity in a photovoltaic (PV) panel string by calculating a discharge ratio, said method comprising:
   operatively coupling a PV panel to a PV panel string;
   measuring a first voltage between points of coupling of said PV panel to said PV panel string;
   disconnecting said PV panel from said PV panel string;
   waiting for a discharge period to expire;
   measuring a second voltage at an expiration of said discharge period;
   calculating a discharge ratio of said second voltage to said first voltage; and
   comparing said discharge ratio to a predetermined threshold ratio.

2. The method of claim 1, wherein said operatively coupling said PV panel to said PV panel string comprises coupling a panel interface device (PID) that is operatively connected to said PV panel to said PV panel string, wherein said PID permits disconnection of said PV panel from said PV panel string, and wherein said PID permits reconnection of said PV panel to said PV panel string.

3. The method of claim 2, wherein said PID comprises a discharge resistance connected between points of coupling of said PID to said PV panel string.

4. The method of claim 3, wherein said predetermined threshold ratio is given by the formula:

$$e^{-T_{DIS}/MR_{PID}C_{INV}}$$

wherein:
   $C_{INV}$ is an input capacitance of an inverter operatively connected to said PV panel string,
   $R_{PID}$ is a discharge resistance,
   $T_{DIS}$ is a discharge period, and
   M is a number of PIDs operatively coupled to said PV panel string.

5. The method of claim 2, wherein said PID disconnects said PV panel from said PV panel string upon any of an open circuit in said PV panel string, a high resistance condition in said PV panel string, and a current below a predetermined threshold value in said PV panel string.

6. The method of claim 2, wherein said PID comprises:
   a switch;
   a controller that controls operation of said switch;
   said discharge resistance operatively connected to said point of coupling;
   an output capacitance operatively connected to said point of coupling; and
   a voltage sensor operatively connected to said point of coupling.

7. The method of claim 6, wherein said PID allows said PV panel to be bypassed when said PV panel cannot match a string current in said PV panel string.

8. The method of claim 6, wherein said PID comprises a "buck" type DC to DC converter.

9. The method of claim 8, further comprising gradually increasing a duty cycle of said "buck" type DC to DC converter to limit a charging current to charge an input capacitance of an inverter operatively connected to said PV panel string.

10. The method of claim 6, further comprising gradually increasing a duty cycle of said switch to limit a charging current to charge an input capacitance of an inverter operatively connected to said PV panel string.

11. The method of claim 2, wherein said PID converts a DC panel voltage at a first level to a DC output voltage at a second level.

12. The method of claim 2, wherein said predetermined threshold ratio is a minimum possible discharge ratio that would occur over said discharge period if said PV panel string is continuous and coupled to an input capacitance of an inverter operatively connected to said PV panel string.

13. The method of claim 2, wherein when said discharge ratio is greater than said predetermined threshold ratio, said method further comprises operatively coupling said PV panel permanently to said PV panel string.

14. The method of claim 2, wherein when said discharge ratio is less than said predetermined threshold ratio, said PV panel remains disconnected from said PV panel string.

15. The method of claim 2, further comprising said PID performing a plurality of discharge ratio measurements.

16. The method of claim 15, further comprising operatively coupling said PV panel permanently to said PV panel string when a minimum number of consecutive discharge ratio measurements are all greater than a predetermined threshold ratio.

17. The method of claim 15, further comprising said PID disconnecting said PV panel from said PV panel string during a waiting period between performing said plurality of discharge ratio measurements.

18. The method of claim 17, wherein a length of said waiting period comprises a random value.

19. The method of claim 15, further comprising said PID operatively coupling said PV panel to said PV panel string during a waiting period between performing said plurality of discharge ratio measurements after a minimum number of consecutive discharge ratio measurements have all been greater than a predetermined threshold ratio.

* * * * *